(12) United States Patent
Reboh et al.

(10) Patent No.: US 11,515,392 B2
(45) Date of Patent: Nov. 29, 2022

(54) SEMICONDUCTOR DIVICE HAVING A CARBON CONTAINING INSULATION LAYER FORMED UNDER THE SOURCE/DRAIN

(71) Applicants: COMMISSARIAT A L'ENERGIE ATOMIQUE ET AUX ENERGIES ALTERNATIVES, Paris (FR); International Business Machines Corporation, Yorktown, NY (US)

(72) Inventors: Shay Reboh, La Buisse (FR); Remi Coquand, Le Touvet (FR); Nicolas Loubet, Albany, NY (US); Tenko Yamashita, Albany, NY (US); Jingyun Zhang, Albany, NY (US)

(73) Assignees: COMMISSARIAT A L'ENERGIE ATOMIQUE ET AUX ENERGIES ALTERNATIVES, Paris (FR); International Business Machines Corporation, Yorktown, NY (US)

( * ) Notice: Subject to any disclaimer, the term of this patent is extended or adjusted under 35 U.S.C. 154(b) by 0 days.

(21) Appl. No.: 17/362,369

(22) Filed: Jun. 29, 2021

(65) Prior Publication Data

US 2021/0328014 A1 Oct. 21, 2021

Related U.S. Application Data

(62) Division of application No. 16/580,396, filed on Sep. 24, 2019, now Pat. No. 11,081,547.

(30) Foreign Application Priority Data

Sep. 25, 2018 (FR) ...................................... 18 58712

(51) Int. Cl.
*H01L 29/66* (2006.01)
*H01L 29/06* (2006.01)
(Continued)

(52) U.S. Cl.
CPC .. *H01L 29/0673* (2013.01); *H01L 21/823431* (2013.01); *H01L 27/0688* (2013.01);
(Continued)

(58) Field of Classification Search
CPC .............. H01L 27/092; H01L 29/0665; H01L 29/0669; H01L 29/66439; H01L 29/7613; H01L 29/775
(Continued)

(56) References Cited

U.S. PATENT DOCUMENTS 9,837,414 B1 12/2017 Balakrishnan et al.
2009/0294822 A1* 12/2009 Batude ................ H01L 27/1104
257/E27.06
(Continued)

OTHER PUBLICATIONS

U.S. Appl. No. 16/580,396, filed Sep. 24, 2019, 2020/0098859 A1, Shay Reboh, et al.
(Continued)

*Primary Examiner* — Hoai V Pham
(74) *Attorney, Agent, or Firm* — Oblon, McClelland, Maier & Neustadt, L.L.P.

(57) ABSTRACT

An electronic device including at least first and second superimposed transistors comprises at least a substrate; a first transistor including a portion of a first nanowire forming a first channel, and first source and drain regions in contact with ends of the first nanowire portion; and a second transistor including a portion of a second nanowire forming a second channel and having a greater length than that of the first channel, and second source and drain regions in contact with ends of the second nanowire portion such that the second transistor is arranged between the substrate and the first transistor. A dielectric encapsulation layer covers at least the second source and drain regions and such that the first source and drain regions are arranged at least partly on
(Continued)

the dielectric encapsulation layer, and forms vertical insulating portions extending between the first and second source and drain regions.

13 Claims, 5 Drawing Sheets

(51) Int. Cl.
  *H01L 21/8234* (2006.01)
  *H01L 27/06* (2006.01)
  *H01L 27/088* (2006.01)
  *H01L 29/423* (2006.01)
  *H01L 29/76* (2006.01)
  *H01L 29/775* (2006.01)

(52) U.S. Cl.
  CPC .... *H01L 27/0886* (2013.01); *H01L 29/42392* (2013.01); *H01L 29/66439* (2013.01); *H01L 29/66545* (2013.01); *H01L 29/7613* (2013.01); *H01L 29/775* (2013.01)

(58) Field of Classification Search
  USPC .......................................................... 257/67
  See application file for complete search history.

(56) References Cited

U.S. PATENT DOCUMENTS

| | | |
|---|---|---|
| 2015/0243733 A1 | 8/2015 | Yang et al. |
| 2017/0040321 A1 | 2/2017 | Mitard |
| 2017/0178971 A1 | 6/2017 | Merckling et al. |
| 2017/0194431 A1 | 7/2017 | Guillorn et al. |
| 2020/0098754 A1 | 3/2020 | Pillarisetty |

OTHER PUBLICATIONS

U.S. Appl. No. 10,879,083, filed Dec. 29, 2020, 2015/0179474 A1, Maitrejean, S., et al.
U.S. Appl. No. 10,665,497, filed May 26, 2020, 2017/0263495 A1, Augendre, E., et al.
U.S. Appl. No. 10,600,786, filed Mar. 24, 2020, 2017/0263607 A1, Maitrejean, S., et al.
U.S. Appl. No. 15/852,050, filed Dec. 22, 2017, 2019/0198614 A1, Reboh, S., et al.
U.S. Appl. No. 10,896,956, filed Jan. 19, 2021, 2019/0198616 A1, Coquand, R., et al.
U.S. Appl. No. 10,553,723, filed Feb. 4, 2020, 2019/0051744 A1, Coquand, R., et al.
U.S. Appl. No. 16/535,367, filed Aug. 8, 2019, 2020/0058768 A1, Coquand, R., et al.
French Preliminary Search Report dated Jun. 14, 2019 in French Application 18 58712 filed on Sep. 25, 2018 (with English Transaltion of Categories of Cited Documents).

* cited by examiner

SEMICONDUCTOR DIVICE HAVING A CARBON CONTAINING INSULATION LAYER FORMED UNDER THE SOURCE/DRAIN

CROSS-REFERENCE TO RELATED APPLICATIONS

This application is a divisional application of and claims the benefit of priority under 35 U.S.C. § 120 to U.S. application Ser. No. 16/580,396, filed Sep. 24, 2019, which claims benefit of priority under 35 U.S.C. § 119 to French Patent Application No. 18 58712, filed on Sep. 25, 2018, the entire contents of each of which are incorporated herein by reference.

DESCRIPTION

Technical Field

The invention relates to making superimposed transistors, especially of the FET ("Field Effect Transistor") type, and advantageously of the GAAFET ("Gate-All-Around Field Effect Transistor") type. The invention is advantageously applied to making transistors intended for high performance low consumption logic applications of microelectronics.

State of Prior Art

GAAFET type transistors are part of the family of transistors having an architecture known as 3D. In such an architecture, the gate of the transistor surrounds the channel, which enables the electrostatic control of the channel made by the gate to be improved.

In a GAAFET transistor, the channel is formed by one or several superimposed nanowires, or nano-layers, and each surrounded by the gate of the transistor. The advantage of this layout is to present a good compromise between the electrostatic control of the channel by the gate and the working current which are obtained. A channel formed by several superimposed nanowires especially enables, with respect to a channel formed by a single nanowire, the value of the current flowing in this channel to be multiplied. The number of superimposed nanowires is generally equal to or lower than three due to the increase in stray capacitances produced by the superimposition of a greater number of nanowires.

In addition to improving the intrinsic performance of each transistor, another purpose is also to improve the density of transistors within semiconducting devices. An existing solution consists in making several superimposed transistors as a 3D stack. Document US 2009/0294822 A1 describes for example the making of such a stack.

The existing methods for making superimposed transistors are however not adapted to all the types of FET transistors, and especially not adapted for forming several superimposed GAA-FET transistors.

Another problem is that the superimposed transistors made cannot always be controlled independently of one another.

These problems can also be found upon making superimposed transistors of another type than FET, such as for example for making superimposed single electron transistors (SET).

Disclosure of the Invention

One aim of the present invention is to present a method for making superimposed transistors that can be controlled independently and which can be implemented to make several types of transistors, and which is especially compatible with making superimposed GAAFET transistors.

To do so, a method for making at least first and second superimposed transistor is presented, including at least:

making, on a substrate, a stack of several semiconductor nanowires;

etching at least a first one of the nanowires so that at least part of a remaining portion of the first nanowire is intended to form a channel of the first transistor;

etching at least a second one of the nanowires arranged between the substrate and the first nanowire, so that at least part of a remaining portion of the second nanowire is intended to form a channel of the second transistor and has a greater length than that of the remaining portion of the first nanowire;

making source and drain regions, called second source and drain regions, in contact with, or arranged against, ends of the remaining portion of the second nanowire;

making first source and drain regions in contact with, or arranged against, ends of the remaining portion of the first nanowire.

In this method, distinct etching steps are implemented to form sequentially the channels of the transistors. These channels are thus made independently of one another by distinct steps. The source and drain regions of the transistors are also formed by implementing distinct steps from one transistor to the other. This independence of the steps implemented for making the channels and the source and drain regions of each of the superimposed transistors enables these transistors to be made so that they are controlled independently of one another. That also enables either superimposed transistors of a same type, for example nFET or pFET, or transistors of opposite types, that is for example nFET and pFET, to be made. The dimensions and/or materials and/or dopings of the elements (channel, source and drain regions, etc.) of each transistor may especially be different from one transistor to the other.

Superimposed transistors can also be made with different geometries, which can give them different electrical characteristics.

The advantage of this method is also to enable the transistors to be integrated on the substrate with a strong density, both vertically (along a stack direction of the transistors which is perpendicular to the face of the substrate on which the transistors are made) and horizontally (along a direction parallel to the face of the substrate on which the transistors are made next to each other).

This method may be implemented to form more than two superimposed transistors. Furthermore, the channel of the first transistor may be formed by the remaining portion of the first nanowire or by the remaining portions of several first nanowires, for example the remaining portions of two or three first nanowires. Similarly, the channel of the second transistor may be formed by the remaining portion of the second nanowire or by the remaining portions of several second nanowires, for example the remaining portions of two or three second nanowires.

The word "nanowire" here refers to an elongated shaped portion the dimensions of which perpendicular to the largest dimension, called the "length", of this portion being lower than about 1 μm, that is are nanosized.

The stack of nanowires is such that the nanowires include their largest dimension facing substantially parallel to the face of the substrate on which the stack of nanowires is made.

Each of the nanowires may have a cross-section, in a plane perpendicular to its length, with a substantially circular or oval or polygonal shape, for example a rectangular or square shape. The diameter or dimension of a side of this cross-section is therefore nanosized.

The expression "source and drain regions" is used here and in all the rest of the document to refer to the regions each forming either the source or the drain of the transistor to which these regions belong.

The second source and drain regions are here directly arranged against the ends of the remaining portion of the second nanowire, and the first source and drain regions are here directly arranged against the ends of the remaining portion of the first nanowire.

The method further includes, between the making of the second source and drain regions and the making of the first source and drain regions, a step of depositing a first dielectric encapsulation layer covering at least the second source and drain regions and forming vertical insulating portions. In addition, the first source and drain regions are arranged at least partly on the first dielectric encapsulation layer such that they are insulated from the second source and drain regions by the vertical insulating portions.

The method may be such that:
at least a third one of the nanowires is arranged between the second nanowire and the substrate;
at least a fourth one of the nanowires is arranged between the first and second nanowires;
the third and fourth nanowires include a second semiconductor able to be selectively etched against a first semiconductor of the first and second nanowires;
upon etching the second nanowire, the third and fourth nanowires are also etched so that remaining portions of the third and fourth nanowires each have a length substantially equal to that of the remaining portion of the second nanowire.

At the end of the etching of the second, third and fourth nanowires, side faces of the ends of the third and fourth nanowires may be aligned with side faces of the ends of the second nanowire.

The fourth nanowire may act as a stop surface upon etching the first nanowire.

The method may further include, between making the stack of nanowires and etching the first nanowire, making at least one dummy gate and first outer dielectric spacers between which the dummy gate is arranged, covering part of the stack of which the remaining portions of the first and second nanowires are part and forming an etching mask upon etching the first nanowire.

In this case, the method may further include, between etching the first nanowire and etching the second nanowire, making second outer dielectric spacers between which the dummy gate, the first outer dielectric spacers and the remaining portion of the first nanowire are arranged, covering part of the stack of which the remaining portion of the second nanowire is part, and wherein:
the dummy gate and the first and second outer dielectric spacers form together an etching mask upon etching the second nanowire;
at least part of the second outer dielectric spacers covering side faces of the ends of the remaining portion of the first nanowire is removed between making the second source and drain regions and making the first source and drain regions.

The method may further include, after making the first source and drain regions:
removing the dummy gate and the remaining portions of the third and fourth nanowires;
making a gate around the remaining portions of the first and second nanowires.

The gate thus made is common to the first and second superimposed transistors.

The first and second transistors made may be of the MOSFET or SET type. However, generally speaking, the first and second transistors may be of the FET type or another type than MOSFET, for example GAAFET.

Advantageously, the first and second nanowires may include silicon, and the third and fourth nanowires may include SiGe.

The method may be such that:
the stack of nanowires further includes at least one fifth nanowire arranged between the first and fourth nanowires and comprising the first semiconductor;
upon etching the first nanowire, the fifth nanowire is also etched so that a remaining portion of the fifth nanowire has a length substantially equal to that of the remaining portion of the first nanowire and forms a separating region between the channels of the first and second transistors.

This fifth nanowire enables a spacing region to be formed between the channels of the first and second transistors enabling the constraints of implementation of certain steps of the method to be reduced, such as for example upon making spacers or for making an encapsulation dielectric layer.

The method may be such that:
the stack of nanowires further includes at least one sixth nanowire arranged between the first and fourth nanowires and comprising the second semiconductor;
upon etching the first nanowire, the sixth nanowire is also etched so that a remaining portion of the sixth nanowire has a length substantially equal to that of the remaining portion of the first nanowire;
and the method may further include, between etching the first and sixth nanowires and etching the second, third and fourth nanowires, etching ends of the remaining portion of the sixth nanowire, forming first cavities between the ends of the first and fourth nanowires, and then making first inner dielectric spacers in the first cavities.

The first source and drain regions may be made such that side faces of the first source and drain regions are in contact with the ends of the remaining portion of the first nanowire and with the first inner dielectric spacers.

The method may further include, between etching the second, third and fourth nanowires and making the second source and drain regions, etching ends of the remaining portions of the third and fourth nanowires, forming second cavities around the ends of the second nanowire, and then making second inner dielectric spacers in the second cavities.

Thus, with this method, the inner dielectric spacers may be made independently for each of the transistors, which for example makes it possible to have different dimensions and/or materials for these inner dielectric spacers from one transistor to the other. The inner dielectric spacers enable, within a transistor, the capacitances to be reduced between the source and drain regions and the gate thanks to the physical separation formed between these elements by the inner dielectric spacers.

The second source and drain regions may be made such that side faces of the second source and drain regions are in contact with the ends of the remaining portion of the second nanowire and with the second inner dielectric spacers.

The first and second source and drain regions may be advantageously made by epitaxy from side faces of the ends of the first and second nanowires.

The method may further include, after making the first source and drain regions, making electrical contacts electrically connected to each of the first and second source and drain regions and so that at least two of the electrical contacts are each connected to only one of the first and second source and drain regions. Thus, in an advantageous layout, it is possible to have a first electrical contact connected to the source regions of both transistors (both transistors are thus connected to each other at a common source), a second electrical contact connected to the drain region of the first transistor, and a third electrical contact (distinct and electrically insulated from the second electrical contact) connected to the drain region of the second transistor.

According to a particular embodiment, the stack of nanowires may be made so that the nanowires have different widths, and especially so that the first nanowire has a different width from that of the second nanowire. The width of the first nanowire may be lower than that of the second nanowire.

According to another embodiment, it is proposed an electronic device including at least a first and second superimposed transistors, comprising at least:

a substrate;

a first transistor including a portion of a first nanowire forming a first channel, and first source and drain regions in contact with ends of the portion of the first nanowire;

a second transistor including a portion of a second nanowire forming a second channel and having a greater length than that of the first channel, or of portion of the first nanowire, and second source and drain regions in contact with ends of the portion of the second nanowire, such that the second transistor is arranged between the substrate and the first transistor;

a first dielectric encapsulation layer covering at least the second source and drain regions and such that the first source and drain regions are arranged at least partly on the first dielectric encapsulation layer, and forming vertical insulating portions extending between the first and second source and drain regions.

BRIEF DESCRIPTION OF THE DRAWINGS

The present invention will be better understood upon reading the description of exemplary embodiments given by way of purely indicative and in no way limiting purposes with reference to the appended drawings in which.

Identical, similar or equivalent parts of the different figures hereinafter described bear the same reference numerals so as to facilitate switching from one figure to the other.

Figure 1:
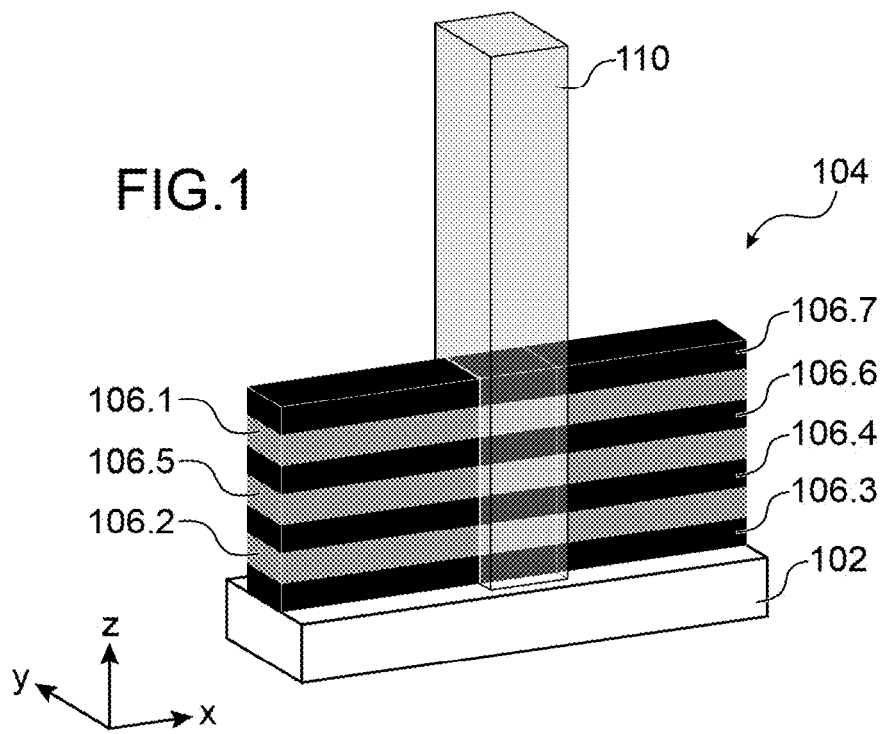
FIGS. 1 to 12B show the steps of a method for making superimposed transistors, which is the object of the present invention, according to a particular embodiment.

The different parts shown on the figures are not necessarily drawn according to a uniform scale, so as to make the figures more understandable.

The different possibilities (alternatives and embodiments) must be understood as being not mutually exclusive and may be combined to each other.

DETAILED DISCLOSURE OF PARTICULAR EMBODIMENTS

FIGS. 1 to 12B show the steps implemented for making superimposed transistors 100, according to a particular embodiment. In this particular embodiment described here, two FET transistors, bearing the reference numerals 100.1 and 100.2, are made.

Transistors 100 are made from a stack of layers of two different crystalline semiconducting materials formed on a substrate 102. In the particular embodiment described here, the substrate 102 corresponds to a bulk substrate of a semiconductor, for example of silicon, on which the stack is arranged, comprising the first and second layers formed of both different semiconducting materials and alternately arranged over each other.

In the particular embodiment described here, the stack includes for example at least three first layers of a first semiconducting material, each of these first layers being arranged between two second layers of a second different semiconducting material from the first semiconducting material.

Furthermore, the second semiconducting material is able to be selectively etched with respect to the first semiconducting material, as well as with respect to the materials of the outer spacers (and possibly the inner spacers) which will be made later.

The first and second semiconducting materials are here crystalline materials and are formed by epitaxy on the substrate 102. In the example described here, the substrate 102 and the first layers include silicon, and the second layers include SiGe with a proportion of germanium for example between about 20% ($Si_{0.8}Ge_{0.2}$) and 50% ($Si_{0.5}Ge_{0.5}$).

Alternatively, the substrate made may correspond to a substrate of the semiconductor on insulator type, for example SOI, with in this case the surface layer, or thin layer, of the SOI substrate which may form one of the second layers of the stack. In the first embodiment described here in which the second layers include SiGe, an SiGeOI type substrate may be used and this SiGeOI substrate can be made from an SOI substrate.

For example each of the first and second layers has a thickness between about 5 nm and 9 nm. These thicknesses especially depend on the desired thicknesses (for example diameters) for the channels of the transistors 100 as well as on the desired spacings around these channels.

The stack of layers comprising the first and second layers is etched as nanowires, or elongated portions, such as shown in FIG. 1 and forming a stack 104 of nanowires arranged on the substrate 102.

A first nanowire 106.1, from one of the first layers comprising the first semiconductor, is intended to be used to form the channel of the first transistor 100.1. A second nanowire 106.2, also from one of the first layers comprising the first semiconductor, is intended to be used to form the channel of the second transistor 100.2. Since the first transistor 100.1 is intended to be arranged above the second transistor 100.2, that is so that the second transistor 100.2 is arranged between the substrate 102 and the first transistor 100.1, the second nanowire 106.2 is arranged between the substrate 106 and the first nanowire 106.1.

The second nanowire 106.2 is arranged between a third nanowire 106.3 and a fourth nanowire 106.4 each from one of the second layers comprising the second semiconductor. The third nanowire 106.3 is arranged between the substrate 102 and the fourth nanowire 106.4. The third and fourth nanowires are subsequently used to form the gate all around the channel of the second transistor 100.2.

The stack 104 further includes a fifth nanowire 106.5, from one of the first layers comprising the first semiconductor, and a sixth nanowire 106.6, from one of the second layers comprising the second semiconductor, which will subsequently be used to form a spacing region between the first and second transistors 100.1, 100.2. The fifth and sixth nanowires 106.5, 106.6 are arranged between the first and fourth nanowires 106.1, 106.4.

Finally, the stack 104 includes a seventh nanowire 106.7 lying on top of the stack and covering the first nanowire 106.1.

Alternatively, the stack 104 may include a different number of nanowires, this number of nanowires especially depending on the number of superimposed transistors made, on the number of nanowires used to form the channel of each of the transistors, possibly on the desired spacing between the transistors, etc. The number of nanowires forming each of the channel regions of the transistors is independent of the number of nanowires forming the channel regions of the other transistors.

Furthermore, in the particular embodiment described here, the initial stack of the semiconductor layers corresponds to a stack of layers of two semiconducting materials alternately arranged over each other. Alternatively, the stack may be formed of layers comprising more than two different materials.

Moreover, the thickness (dimension along the axis Z, that is along the direction substantially perpendicular to the face of the substrate 102 on which the stack 104 lies) of the nanowires may be similar or not from one nanowire to the other. In an alternative embodiment, the fifth nanowire 106.5 forming the separation between both transistors 100.1 and 100.2 may have a thickness greater than that of the other nanowires, for example greater than that of the first and second nanowires 106.1, 106.2, in order to obtain the desired distance between transistors 100.

The width of the stack 104, which corresponds to the dimension substantially parallel to the axis Y which can be seen in FIG. 1, is here equal to the desired width of the nanowires intended to form the channels of the transistors (here the first and second nanowires 106.1 and 106.2), and therefore equal to the desired width of the channels of the transistors 100.

A dummy gate 110 is then made, for example by lithography and etching, on the stack 104, at a location intended for making the future gate of the transistors 100. The dummy gate 110 is formed on part of the stack 104 especially including part of the first nanowire 106.1 intended to form the channel of the first transistor 100.1. The dummy gate 110 also covers side flanks of this part of the stack 104 (at the faces of the stack 104 parallel to the plane (X, Z)).

Figure 2:
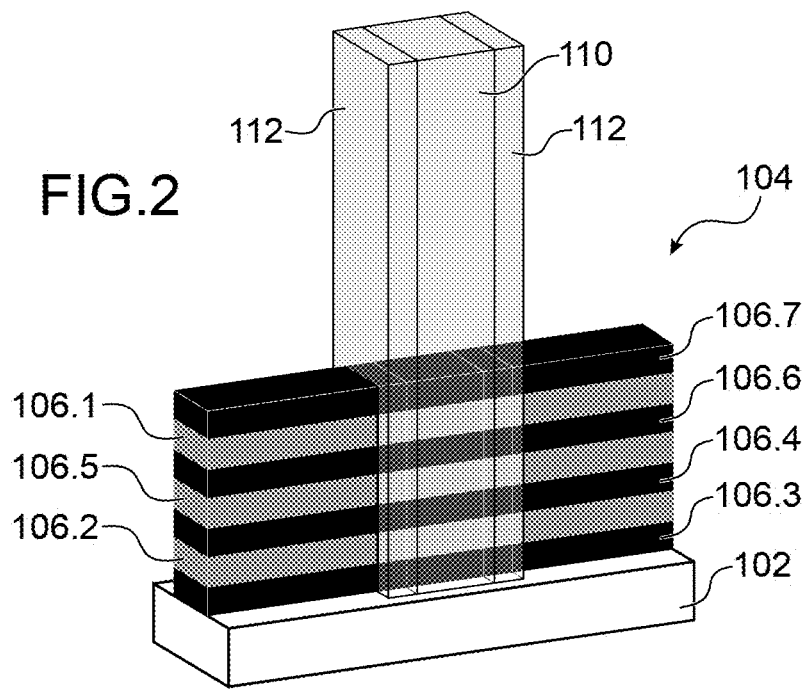
Figure 3:
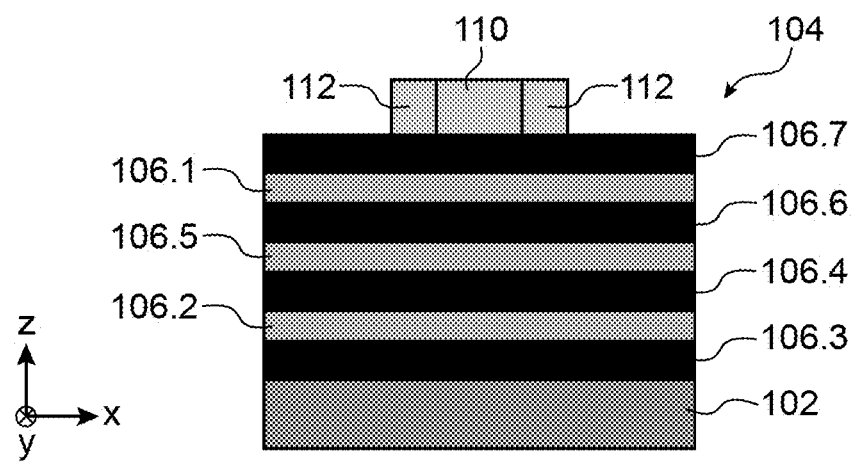

As shown in FIG. 2, first outer dielectric spacers 112 are then made, for example by depositing and etching, on the stack 104, the dummy gate 110 being arranged between these first outer dielectric spacers 112. These first outer dielectric spacers 112 cover parts of the stack 104 especially including parts of the first nanowire 106.1 intended to form source and drain extension regions of the first transistor 100.1. The length, or depth, of these first outer dielectric spacers 112 (dimension parallel to the axis X shown in FIG. 2) is for example between about 3 nm and 8 nm. The first outer dielectric spacers 112 are intended to insulate the gates (which will be made at a subsequent step of the method) from the source and drain regions of the transistors 100. FIG. 3 shows a cross-section view parallel to the plane (X,Z) of the structure obtained at this stage of the method.

The dummy gate 110 includes for example amorphous or polycrystalline silicon, and the first outer dielectric spacers 112 for example include SiN and/or $Si_3N_4$ and/or SiBCN.

Figure 4:
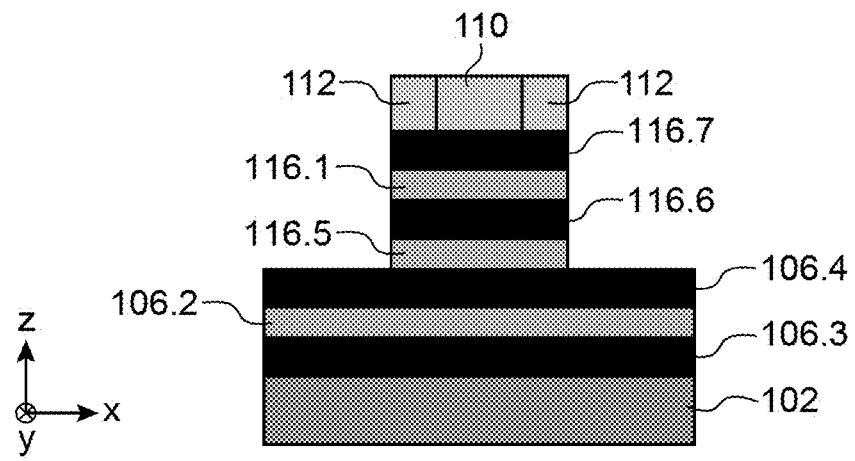

The parts of the stack 104 not covered by the dummy gate 110 and by the first outer dielectric spacers 112 are subsequently partially etched, only on part of the height of the stack 104 (refer to FIG. 4). This etched part of the stack 104 corresponds to an upper part of the stack 104, on the opposite side to the one where the substrate 102 lies. In the exemplary embodiment described here, the first, fifth, sixth and seventh nanowires 106.1, 106.5, 106.6 and 106.7 are etched according to the etching mask pattern formed by the dummy gate 110 and the first outer dielectric spacers 112. The second nanowire 106.2 and the third and fourth nanowires 106.3, 106.4 are not etched, or are little etched (the material of the fourth nanowire 106.4 possibly acting as an etching stop layer). More generally, the nanowires intended to form parts of the first transistor 100.1 and the nanowire(s) intended to form the spacing region between the first and second transistors 100.1, 100.2 are etched during this etching step, unlike the nanowire(s) intended to form parts of the second transistor 100.2 which are not impacted by this etching.

Such an etching may correspond to an anisotropic etching implemented for a predefined duration which corresponds to the time necessary to etch the desired nanowires.

Alternatively, the etching may be implemented with a piece of equipment providing, as an information feedback, the nature of the etched material. For example this information may be obtained by a control of the nature of the gases emitted upon etching, or by an optical control (for example by spectroscopy) of the ambient gases during etching. In this case, the duration of this etching may not be predefined, and etching may be stopped when the etching piece of equipment indicates that the nature of the material which starts to be etched corresponds to that on which etching must be stopped, that is here the fourth nanowire 106.4 (knowing the number of different nanowires which have been previously etched).

According to another alternative, since the nanowires 106 include materials that can be selectively etched with respect to each other (as is here the case with silicon and SiGe), it is possible to successively etch each of the desired nanowires 106 with an etchant selectively removing the material to be etched, for example so as to stop the etching of silicon after removing SiGe and vice versa. An HCl solution may be used, for example for a selective etching of SiGe against silicon.

At least part of a remaining portion 116.1 of the first nanowire 106.1 obtained at the end of this etching is intended to form the channel of the first transistor 100.1. This remaining portion 116.1 is interposed between two remaining portions 116.6 and 116.7 of the sixth and seventh nanowires 106.6 and 106.7.

A remaining portion 116.5 of the fifth nanowire 106.5 is intended to form a separation area between the channels of the transistors 100.1, 100.2. This portion 116.5 is arranged between the remaining portion 116.6 of the sixth nanowire 106.6 and the fourth nanowire 106.4 lying in the non-etched part of the stack 104.

The remaining portions 116.1, 116.5, 116.6 and 116.7 each have a shape corresponding to that of a nanowire of a lower length than that of the initial nanowires 106.

First cavities may subsequently be made under the first outer spacers 112 by etching the ends of the remaining portions 116.6 and 116.7 (a few nanometres along the direction parallel to the length of these portions, here parallel to the axis X, for example between about 3 nm and 8 nm). The depth of these first cavities may be equal to or different from the length of the first outer spacers 112. First inner dielectric spacers 118 may subsequently be made in these first cavities, by depositing a dielectric material in these first cavities (refer to FIG. 5). For example the first inner dielectric spacers 118 include SiN and/or at least one low permittivity dielectric material (known as "Low-k" material) such as for example SiBCN. The excess deposited dielectric material lying outside the first cavities may be removed for example by using ortho-phosphoric acid $H_3PO_4$.

According to an alternative embodiment, it is possible not to make the first inner dielectric spacers 118 and to keep the portions 116.6 and 116.7 with a length similar to that of the portions 116.1 and 116.5. Moreover, the first inner dielectric spacers 118 made at the portion 116.6 may be similar or not (dimensions, materials, etc.) to those made at the portion 116.7.

Figure 5:
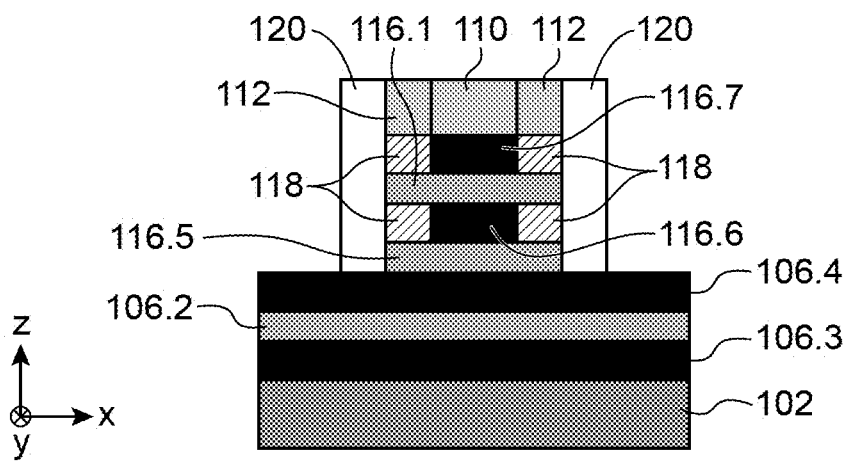

The upper part of the structure, that is the assembly formed by the portions 116.1, 116.5, 116.6, 116.7, of the first inner dielectric spacers 118 as well as the parts of the dummy gate 110 and the first outer dielectric spacers 112 formed around these elements, is subsequently insulated while forming second outer dielectric spacers 120 around this upper part of the structure (refer to FIG. 5). These second outer dielectric spacers 120 are for example made by depositing and anisotropic etching. These second outer dielectric spacers 120 cover parts of the stack 104 which are intended not to be etched during the subsequent etching step (described in relation to FIG. 6). These second outer dielectric spacers 120 cover parts of the stack 104 especially including parts of the remaining portion 116.2 intended to form source and drain extension regions of the second transistor 100.2. The length, or depth, of these second outer dielectric spacers 120 (dimension parallel to the axis X shown in FIG. 5) is for example between about 3 nm and 8 nm.

The second outer dielectric spacers 120 for example include SiN and/or $Si_3N_4$ and/or SiBCN. In order to have an etching selectivity between the material of the second outer dielectric spacers 120 and that of the first outer dielectric spacers 112 (etching step described later in relation to FIG. 9), the first outer dielectric spacers 112 may include SiBCN and the second outer dielectric spacers 120 may include SiN.

Figure 6:
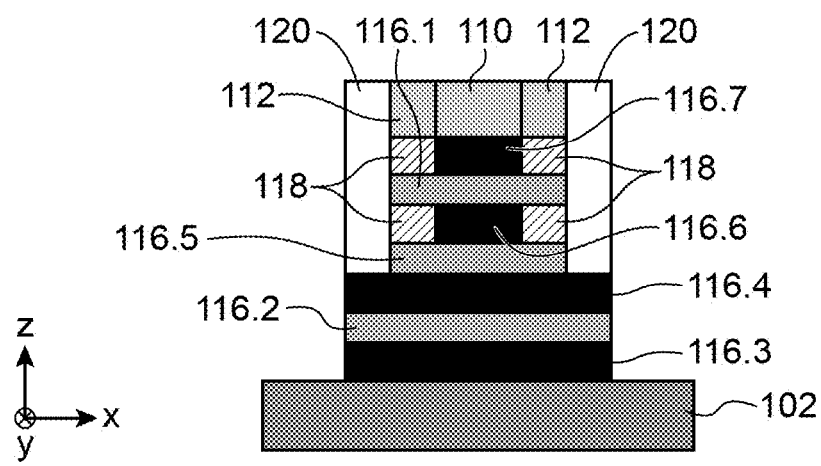
Figure 7:
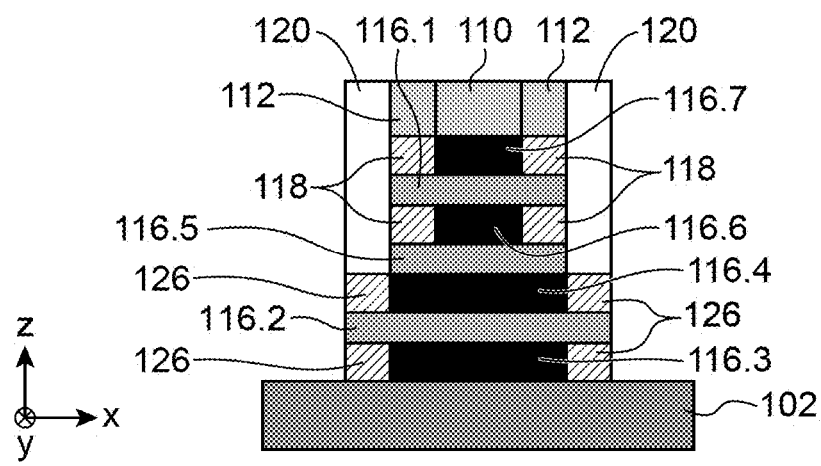

As shown in FIG. 6, the remaining parts of the stack 104 which are not covered by the second outer dielectric spacers 120 and by the first outer dielectric spacers 112 and by the dummy gate 110 are subsequently etched, with a stop on the substrate 102. At least part of a remaining portion 116.2 of the second nanowire 106.2 obtained at the end of this etching is intended to form the channel of the second transistor 100.2. This remaining portion 116.2 is interposed between two remaining portions 116.3 and 116.4 of the third and fourth nanowires 106.3 and 106.4.

Second cavities may subsequently be made under the second outer dielectric spacers 120 by etching the ends of the remaining portions 116.3 and 116.4 (a few nanometres along the direction parallel to the length of these portions, here parallel to axis X, for example between about 3 nm and 8 nm). The depth of these second cavities may be equal to or different from the length of the second outer dielectric spacers 120. Second inner dielectric spacers 126 may subsequently be made in these second cavities, by depositing a dielectric material, for example SiN and/or SiBCN, in these second cavities (refer to FIG. 7). The excess deposited dielectric material lying outside the second cavities may be removed for example by using ortho-phosphoric acid $H_3PO_4$.

According to an alternative embodiment, it is possible not to make the second inner dielectric spacers 126 and to keep the portions 116.3 and 116.4 with a similar length to that of the second portion 116.2.

Figure 8:
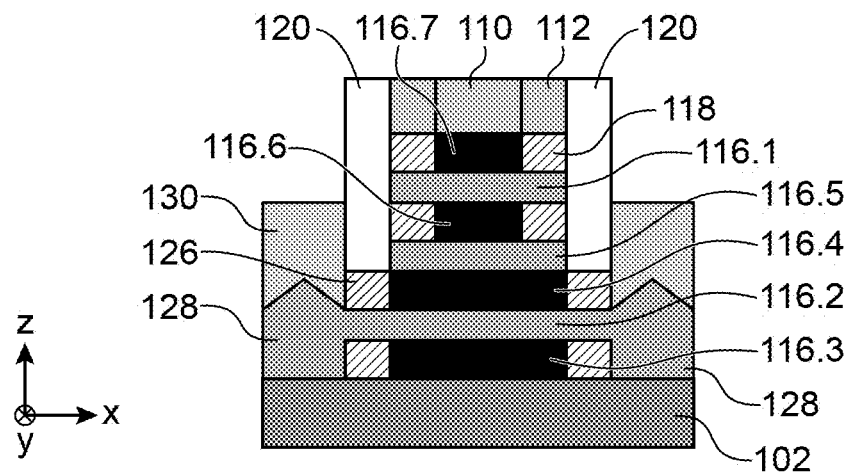
Figure 9:
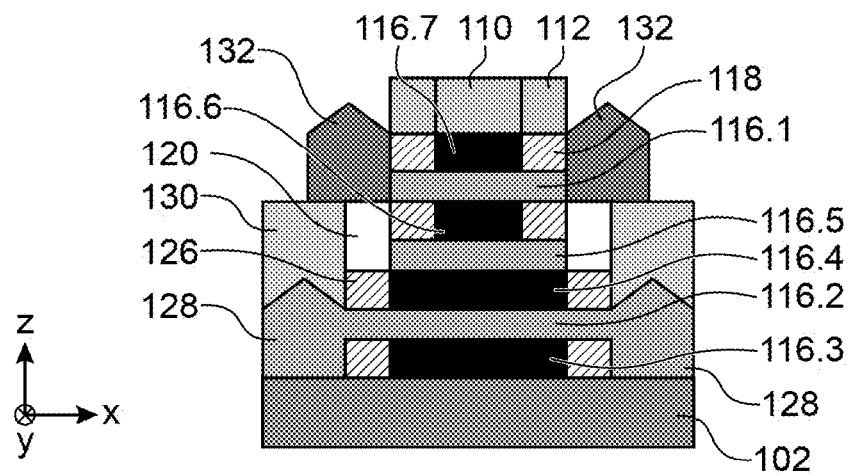

As shown in FIG. 8, second source and drain regions 128 of the second transistor 100.2 are made by epitaxy from the ends of the second portion 116.2 forming the source and drain extension regions of the second transistor 100.2 (and possibly from the upper face of the substrate 102 if the exposed surface includes crystalline semiconductor). The semiconductor of the second source and drain regions 128 is for example doped in-situ, that is doped during the making in the depositing equipment. The type of dopant as well as the type of semiconductor made depend on the type of the second transistor 100.2. Thus, if this transistor 100.2 is of the nMOS type, the semiconductor formed by epitaxy for making the second source and drain regions 128 may correspond to silicon doped with phosphorous. If the transistor 100.2 is of the pMOS type, the semiconductor formed by epitaxy for making the second source and drain regions 128 may correspond to SiGe doped with boron.

The second source and drain regions 128 are made such that side faces of the second source and drain regions 128 are in contact with the ends of the second portion 116.2 but also with the second inner dielectric spacers 126.

A first encapsulation dielectric layer 130 is subsequently formed by covering at least the second source and drain regions 128 in order to protect these regions from the subsequently implemented steps. For example this first encapsulation dielectric layer 130 corresponds to an oxide layer conformally deposited and then partially etched so that the upper face of the part kept of this layer forms an etching stop surface. The first encapsulation dielectric layer 130 forms vertical insulating portions, i.e. insulating portions which are oriented parallel to the direction of the stack of layers forming the transistors 100.1 and 100.2 (direction parallel to the Z axis shown on FIGS. 1 to 12A). In other words, each of the vertical insulating portions has a main dimension which is perpendicular to the length of the channels of the transistors 100.1 and 100.2 (the length of a channel being the direction of movement of the electric charges between the source and the drain of the transistor).

The second outer dielectric spacers 120 are subsequently partially etched up to the stop surface formed by the first encapsulation dielectric layer 130. The etchant used is such that the second outer dielectric spacers 120 are selectively etched with respect to the first outer dielectric spacers 112. This etching reveals the side faces of the remaining portion 116.1 from which an epitaxy is implemented to form first source and drain regions 132 of the first transistor 100.1, that is that the channel region of which is formed by the remaining portion 116.1 (refer to FIG. 9). The first source and drain regions 132 are made such that side faces of the first source and drain regions 132 are in contact with the ends of the remaining portion 116.1 and with the first inner dielectric spacers 118.

The first source and drain regions are arranged at least partly on the first dielectric encapsulation layer such that they are insulated from the second source and drain regions by the vertical insulating portions.

As for the second source and drain regions 128, the nature of the semiconducting material formed by growth as well as the doping of this material forming the first source and drain regions 132 are especially chosen as a function of the N or P type of the first transistor 100.1.

Figure 10:
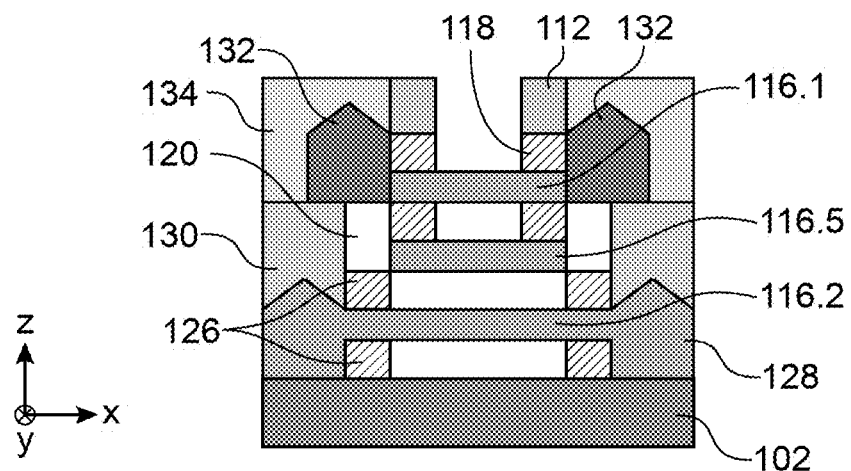

As shown in FIG. 10, the second source and drain regions 132 are covered with a second encapsulation dielectric layer 134, for example similar to the first encapsulation dielectric layer 130. The dummy gate 110 as well as the remaining portions 116.3, 116.4, 116.6 and 116.7, which correspond to the remaining portions of SiGe, are subsequently removed.

Figure 11:
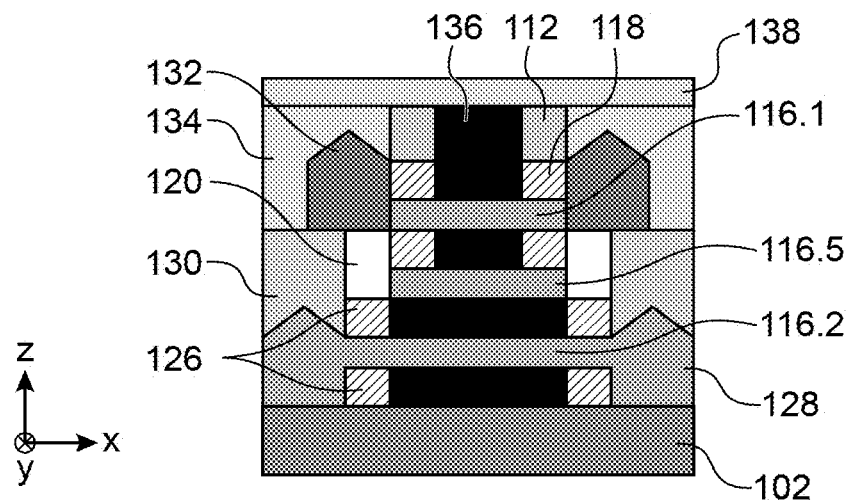

The space freed by the removal of the dummy gate 110 and of the remaining portions 116.3, 116.4, 116.6 and 116.7 is then filled with materials forming the gates of the transistors 100.1 and 100.2. These gates are for example formed by a first conformal deposition of a first dielectric material, for example SiO$_2$, with a thickness for example equal to or lower than about 1 nm, especially covering the parts of the semiconducting portions 116.1, 116.2 and 116.5 (which correspond to the remaining portions of silicon having resisted during the previous etching) which can be accessed from the freed space, a second conformal deposition of a second dielectric material, for example a "High-k" type dielectric, or with a strong permittivity (that is greater than that of SiO$_2$) and forming together a gate dielectric. An electrically conducting material, for example a metallic material corresponding for example to TiN, is subsequently deposited by filling the remaining space to form the gates 136 of the transistors 100.1, 100.2. A third encapsulation dielectric layer 138 may be deposited to cover the assembly of the structure made (FIG. 11).

Figure 12A:
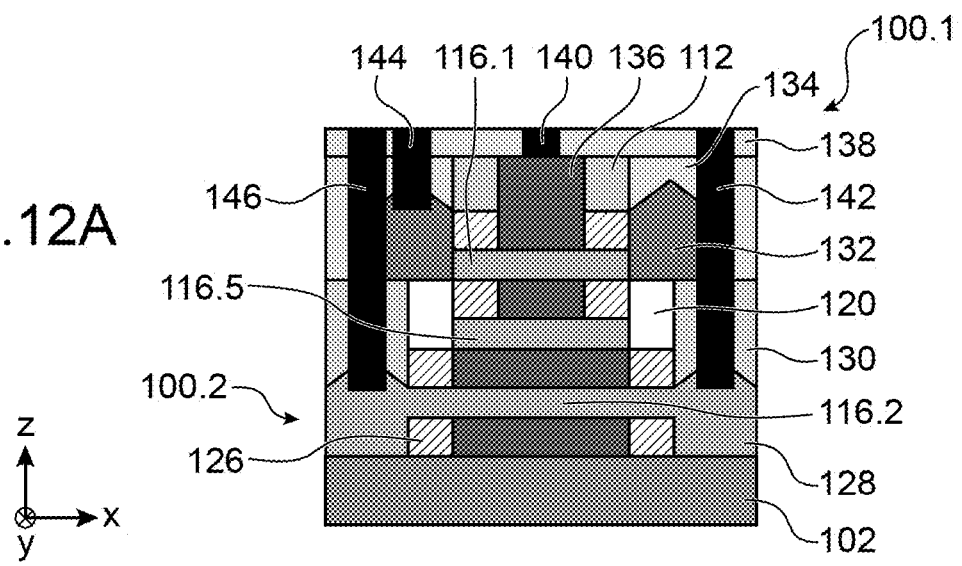
Figure 12B:
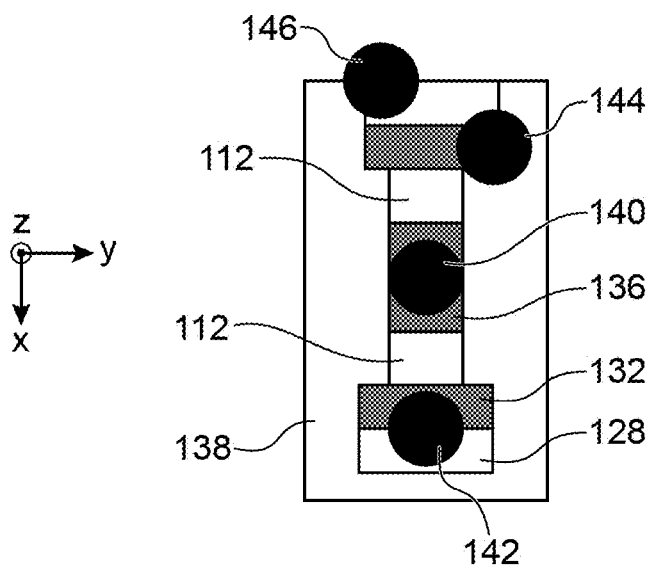

As shown in FIGS. 12A and 12B, electrical contacts connected to the electrodes of the transistors 100.1, 100.2 are then made through the encapsulation dielectric layers 138, 134, 130. In these figures, a first electrical contact 140 is formed through the third encapsulation dielectric layer 138 and is electrically connected to the gates 136 of the transistors 100.1, 100.2. A second electrical contact 142 is formed through the encapsulation dielectric layers 138, 134 and 130 and is electrically connected to one of the first source and drain regions 132 of the first transistor 100.1 as well as to one of the second source and drain regions 128 of the second transistor 100.2 which both correspond to the source regions of these transistors (these two transistors being therefore electrically connected to each other at a common source). A third electrical contact 144 is formed through the encapsulation dielectric layers 138, 134 and is connected to the other of the source and drain regions 132 of the first transistor 100.1 which corresponds to the drain region of this transistor. A fourth electrical contact 146, distinct from the third electrical contact 144, goes through the encapsulation dielectric layers 130, 134, 138 and is connected to the other of the second source and drain regions 128 of the second transistor 100.2 which corresponds to the drain region of this transistor, without being in electrical contact with the drain region of the first transistor 100.1.

The fact that the drain contacts 144, 146 of both transistors 100.1, 100.2 are distinct is possible because both transistors include their source and drain regions 128, 132 which are offset from each other in a plane parallel to the face of the substrate 102 on which the transistors are made (plane perpendicular to the main direction along which the contacts 144, 146 extend), and also arranged at different depths (different distances from the substrate 102).

The electrical contacts 140, 142, 144 and 146 are made for example by the common implementation of steps of lithography, etching and deposition of electrically conducting material, for example a metallic material. Details of embodiment of such electrical contacts are described in document US 2009/294822 A1.

Each of the first and second transistors 100.1, 100.2 may be controlled independently of one another, in a non-simultaneous way since the gate contact 140 is common to both transistors 100.1, 100.2. Both transistors 100.1, 100.2 may however be simultaneously controlled, but in a non-independent way.

The remaining portion 116.5 which lies between the portions 116.1 and 116.2 forming the channels of both transistors 100.1, 100.2 has no electrical function but forms a buffer area, or a spacing region, between these two transistors, and more specifically between the channels of the first and second transistors 100.1, 100.2. The height of the initial layer from which this portion 116.5 is made may especially be chosen as a function of the height of the desired spacing between the transistors. This spacing area especially facilitates forming the different spacers.

In the particular embodiment previously described, the semiconductor of portion 116.5 is similar to that of the portions 116.1, 116.2 forming the channels of the transistors. However, this portion 116.5 may include a different crystalline material from the other semiconductors of the stack 104, such as for example doped silicon or SiGe with a different germanium concentration, for example greater than that of SiGe of the other SiGe layers of the stack 104. Thus, during a step of the method where the semiconductor of this portion can be accessed, it is possible to make a selective oxidation of this semiconductor, which enables a buffer layer or spacing layer to be formed, comprising semiconductor oxide forming a better insulation from the electrical currents.

Alternatively, it is possible not to have this portion 116.5 acting as a spacing area between both transistors.

The first and second transistors 100.1, 100.2 may be of a same type or of different types.

In the particular embodiment previously described, the first and second transistors 100.1, 100.2 have similar geometries (except for the lengths of the channels which are different). Alternatively, the previously described method may be implemented so that the geometry of the first transistor 100.1 is different from that of the second transistor 100.2, in order to give different electrical characteristics to these two transistors.

Figure 13:
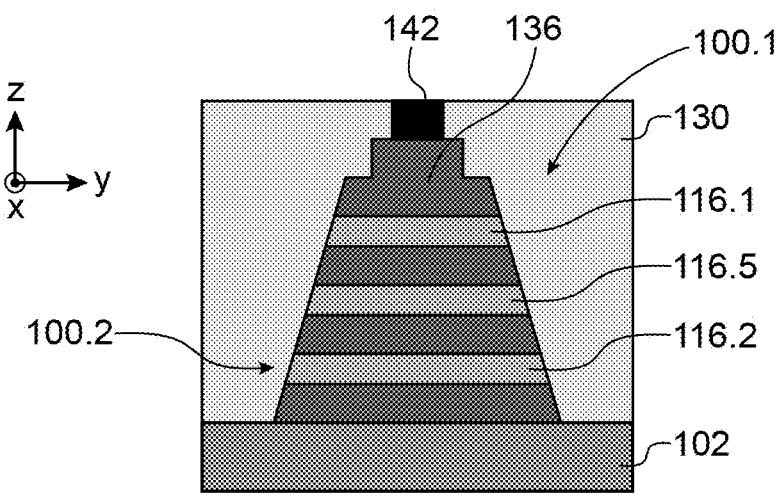
FIG. 13 shows superimposed transistors obtained by implementing a making method, which is the object of the present invention, according to an alternative embodiment.

For example, upon etching the initial stack to form the stack 104, the etching method may be adjusted in order to form a trapezoidal shape stack 104. The transistors 100 obtained at the end of the method therefore have channels formed by semiconducting portions 116.1, 116.2 of different widths, as can be seen in FIG. 13 which shows a cross-section view of such transistors 100.1, 100.2. By way of example, the width of the portion 116.2 forming the channel of the second transistor 100.2 may be equal to about 40 nm, and that of the portion 116.1 forming the channel of the first transistor 100.1 may be equal to about 20 nm.

The above-described method for making transistors 100 may be implemented for making transistors 100 of a type other than FET, such as for example for making SET transistors.

The invention claimed is:
1. An electronic device including at least first and second superimposed transistors, comprising at least:
    a substrate;
    a first transistor including a portion of a first nanowire forming a first channel, and first source and drain regions in contact with ends of the portion of the first nanowire;
    a second transistor including a portion of a second nanowire forming a second channel and having a greater length than that of the first channel, and second source and drain regions in contact with ends of the portion of the second nanowire, such that the second transistor is arranged between the substrate and the first transistor; and
    a first dielectric encapsulation layer covering at least the second source and drain regions and such that the first source and drain regions are arranged at least partly on the first dielectric encapsulation layer, and forming vertical insulating portions extending between the first and second source and drain regions.

2. The electronic device according to claim 1, further comprising a portion of another nanowire having a length substantially equal to that of the portion of the first nanowire and forming a separating region between the channels of the first and second transistors.

3. The electronic device according to claim 2, wherein:
a width of the portion of the first nanowire is smaller than a width of the portion of said another nanowire, and
a width of the portion of the said nanowire is smaller than a width of the portion of the second nanowire.

4. The electronic device according to claim 1, further comprising first inner dielectric spacers arranged around ends of the portion of the first nanowire, and wherein side faces of the first source and drain regions are in contact with the ends of the portion of the first nanowire and with the first inner dielectric spacers.

5. The electronic device according to claim 4, further comprising first outer dielectric spacers arranged above the first inner dielectric spacers.

6. The electronic device according to claim 4, wherein the first source and drain regions comprise side faces which are in contact, or partially in contact, with the ends of the portion of the first nanowire and with the first inner dielectric spacers.

7. Electronic device according to claim 1, further comprising second inner dielectric spacers arranged around ends of the portion of the second nanowire, and wherein side faces of the second source and drain regions are in contact with the ends of the portion of the second nanowire and with the second inner dielectric spacers.

8. The electronic device according to claim 7, further comprising second outer dielectric spacers arranged above the second inner dielectric spacers.

9. The electronic device according to claim 7, wherein the second source and drain regions comprise side faces which are in contact, or partially in contact, with the ends of the portion of the second nanowire and with the second inner dielectric spacers.

10. The electronic device according to claim 1, wherein the first and second transistors are of the FET or SET type.

11. The electronic device according to claim 1, further comprising electrical contacts electrically connected to each of the first and second source and drain regions and so that at least two of the electrical contacts are each connected to only one of the first and second source and drain regions.

12. The electronic device according to claim 1, wherein a width of the portion of the first nanowire is smaller than a width of the portion of the second nanowire.

13. The electronic device according to claim 1, wherein the first source and drain regions are n-doped, and the second source and drain regions are p-doped.

* * * * *